United States Patent
Gu et al.

(10) Patent No.: US 12,457,731 B2
(45) Date of Patent: Oct. 28, 2025

(54) BOTTOM CONTACT FORMATION FOR $4F^2$ VERTICAL DRAM

(71) Applicant: Applied Materials, Inc., Santa Clara, CA (US)

(72) Inventors: Sipeng Gu, Clifton Park, NY (US); Qintao Zhang, Mt Kisco, NY (US); Kyu-Ha Shim, Andover, MA (US)

(73) Assignee: Applied Materials, Inc.

( * ) Notice: Subject to any disclaimer, the term of this patent is extended or adjusted under 35 U.S.C. 154(b) by 500 days.

(21) Appl. No.: 17/963,555

(22) Filed: Oct. 11, 2022

(65) Prior Publication Data

US 2024/0121937 A1 Apr. 11, 2024

(51) Int. Cl.
*H10B 12/00* (2023.01)
*H10D 30/01* (2025.01)

(52) U.S. Cl.
CPC ......... *H10B 12/056* (2023.02); *H10D 30/024* (2025.01)

(58) Field of Classification Search
CPC .............................. H10B 12/056; H10D 30/024
See application file for complete search history.

(56) References Cited

U.S. PATENT DOCUMENTS

| 5,354,381 | A | 10/1994 | Sheng |
| 5,711,812 | A | 1/1998 | Chapek et al. |
| 10,106,892 | B1* | 10/2018 | Siddiqui ............ C23C 16/45536 |
| 2020/0013879 | A1* | 1/2020 | Li ......................... H10D 30/025 |
| 2023/0013383 | A1* | 1/2023 | Miao .................... H10D 84/038 |

OTHER PUBLICATIONS

Qin, "Device Performance Improvement of PMOS Devices Fabricated by B2H6 PIII/PLAD Processing," IEEE Transactions on Electron Devices, vol. 54, No. 9, Sep. 2007, pp. 2497-2502.
Chung et al., "Novel 4F2 Dram Cell with Vertical Pillar Transistor(VPT)," 978-1-4577-0708-7/11/, 2011 IIEE, pp. 211-214.
Cho et al., "Suppression of the Floating-Body Effect of Vertical-Cell DRAM With the Buried Body Engineering Method," IEEE Transactions on Electron Devices, vol. 65, No. 8, Aug. 2018, pp. 3237-3242.

\* cited by examiner

*Primary Examiner* — Mohammad A Rahman
(74) *Attorney, Agent, or Firm* — KDW Firm PLLC

(57) ABSTRACT

Disclosed herein are approaches for forming contacts in a $4F^2$ vertical dynamic random-access memory device. One method includes providing a plurality of fins extending from a substrate, forming a spacer layer over the plurality of fins, and etching the substrate to expose a base portion of the plurality of fins. The method may include forming a doped layer along the base portion of the plurality of fins and along an upper surface of the substrate, and forming an oxide spacer over the doped layer.

17 Claims, 4 Drawing Sheets

BOTTOM CONTACT FORMATION FOR 4F² VERTICAL DRAM

FIELD OF THE DISCLOSURE

The present disclosure relates to semiconductor structures and, more particularly, to methods for forming contacts in a 4F² vertical dynamic random-access memory (DRAM) device.

BACKGROUND OF THE DISCLOSURE

As dynamic random-access memory (DRAM) devices scale to smaller dimensions, an increasing emphasis is placed on patterning for forming three dimensional structures, including trenches for storage nodes as well as access transistors. In current DRAM devices, transistors may be formed using narrow and tall, vertical semiconductor fin structures, often made from monocrystalline silicon. In accordance with current trends, the aspect ratio of such fin structures, meaning the height (depth) of a fin divided by the spacing between adjacent fins, may reach 20:1 or more in the coming years.

In an effort to continue scaling smaller, 4F² DRAM devices have been developed. However, current 4F² DRAM devices have off-leakage current issues for vertical channel transistors. The off-leakage current is caused by the floating body effect caused by hole accumulation into the body of the 4F² DRAM device.

It is with respect to these and other drawbacks of the current art that the present disclosure is provided.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, a method may include providing a plurality of fins extending from a substrate, forming a spacer layer over the plurality of fins, and etching the substrate to expose a base portion of the plurality of fins. The method may further include forming a doped layer along the base portion of the plurality of fins and along an upper surface of the substrate, and forming an oxide spacer over the doped layer.

In another aspect, a method of forming a DRAM device may include providing a plurality of fins extending from a substrate, forming a spacer layer over the plurality of fins, and etching the substrate to expose a base portion of the plurality of fins. The method may further include forming, using a plasma doping process, a doped layer along the base portion of the plurality of fins and along an upper surface of the substrate, and forming an oxide spacer over the doped layer.

In yet another aspect, a method of forming a 4F² vertical dynamic random-access memory device may include providing a plurality of fins extending from an upper surface of a substrate, forming a spacer layer over the plurality of fins, and exposing a base portion of the plurality of fins by etching the upper surface of the substrate. The method may further include forming, using a plasma doping process, a doped layer along the base portion of the plurality of fins and along the upper surface of the substrate, and forming an oxide spacer over the doped layer.

BRIEF DESCRIPTION OF THE DRAWINGS

The accompanying drawings illustrate exemplary approaches of the disclosure, including the practical application of the principles thereof, as follows.

Figure 1:
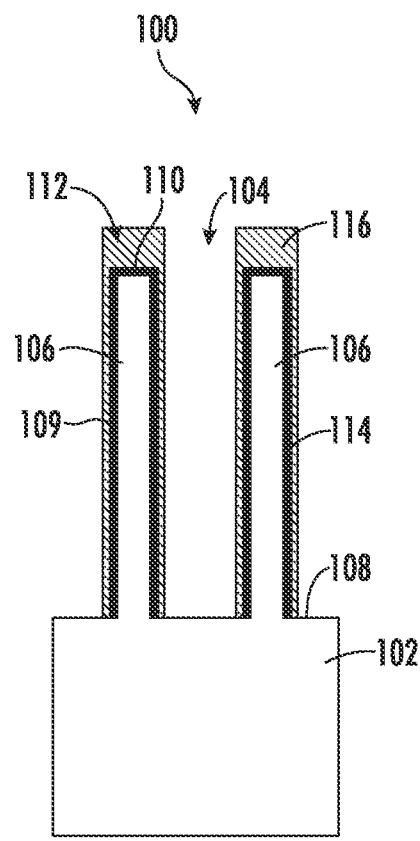
FIG. 1 is a cross-sectional side view of a device including a substrate and a plurality of fins, according to embodiments of the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods and devices in accordance with the present disclosure will now be described more fully hereinafter with reference to the accompanying drawings, where various embodiments are shown. The methods and devices may be embodied in many different forms and are not to be construed as being limited to the embodiments set forth herein. Instead, these embodiments are provided so the disclosure will be thorough and complete, and will fully convey the scope of the methods to those skilled in the art.

To address the deficiencies of the prior art described above, described herein are bottom contact formation techniques to address floating body effects for vertical DRAM cell transistors. More specifically, using a plasma doping method to form ultra-shallow S/D doping on the sidewalls and the bottom of device fins/pillars, a hole run path inside the fins/pillars is provided, which eliminates the floating body effect.

FIG. 1 is a side cross-sectional view of a portion of semiconductor device (hereinafter "device") 100, such as a DRAM device, according to one or more embodiments. As shown, the device 100 may include a base or substrate 102 including a plurality of trenches 104 and a plurality of device structures, which may be pillars or fins 106 extending vertically from an upper surface 108 of the substrate 102. Although non-limiting, the substrate 102 and the fins 106 may be made from a same, homogenous material, such as silicon. The trenches 104 may be formed using one or more blocking and vertical etch processes.

As further shown, a spacer layer 112 may be formed over each outer surface sidewall 109 and upper surface 110 of the fins 106. In some embodiments, the spacer layer 112 may be a uniform oxide layer or other dielectric layer(s) formed using a conformal oxide process or a dielectric deposition process, such as chemical vapor deposition (CVD), low-pressure CVD (LPCVD), plasma-enhanced CVD (PECVD), or atomic layer deposition (ALD). In other embodiments, the spacer layer 112 may include an oxide layer (e.g., $SiO_2$) 114 formed over the sidewalls 109 and the upper surface 110 of the fins 106, and a nitride layer (e.g., SiN) 116 formed over the oxide layer 114. It will be appreciated that the spacer layer 112 may include additional and/or alternative materials in other embodiments.

Figure 2:
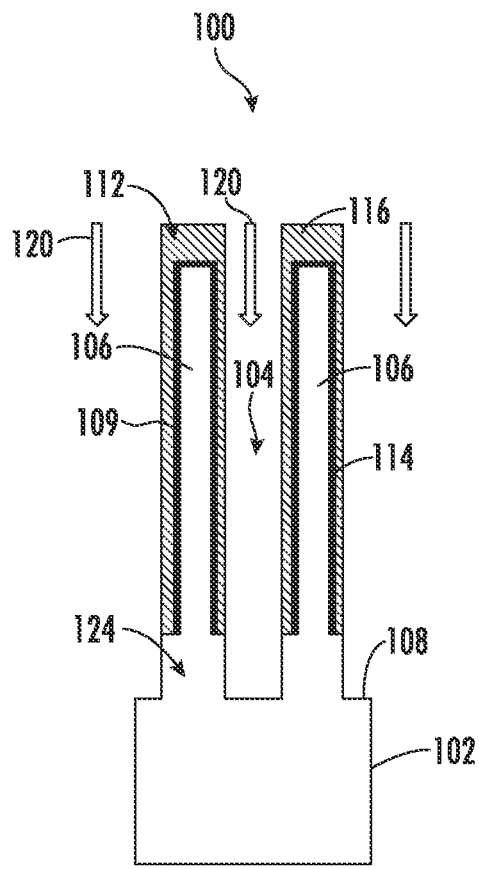
FIG. 2 is cross-sectional side view of the device following an etch, according to embodiments of the present disclosure.

Next, as shown in FIG. 2, the device 100 may be etched 120 to recess the upper surface 108 of the substrate 102 and to expose a base portion 124 of the sidewalls 109 of the fins 106. The portion 124 of each fin 106 is exposed in the sense that it is not covered by the spacer layer 112.

Figure 3:
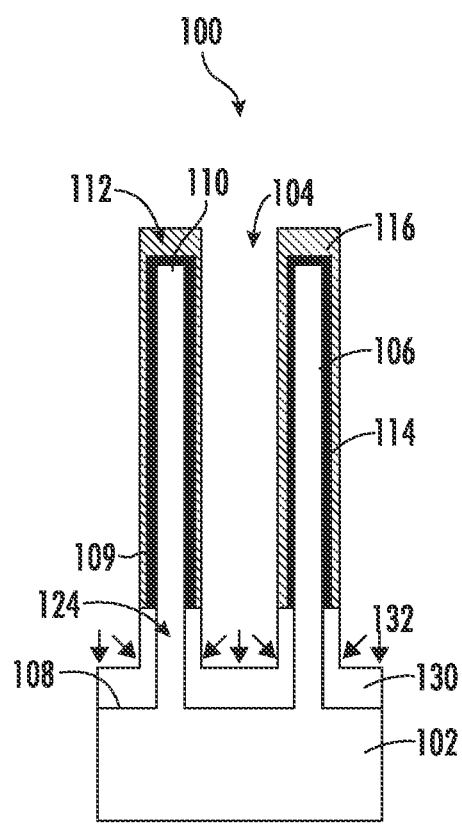
FIG. 3 is a cross-sectional side view of the device during formation of a doped a layer, according to embodiments of the present disclosure.

As shown in FIG. 3, a doped layer 130 may then be formed along the portion 124 of each fin 106 and along the upper surface 108 of the substrate 102. In some embodiments, forming the doped layer 130 includes doping the device 100 using a plasma doping (PLAD) process 132. PLAD is used to form conformal and shallow junctions on the substrate 102. With it, high density As or B doping could be achieved at the Si surface. PLAD provides advantages over conventional beam-line ion implant system, including system simplicity, lower cost, higher throughput and device performance improvement. In various embodiments, PLAD may dope N and/or P type dopants, such as As+, B+ etc. As shown, the doped layer 130 extends along the sidewalls 109 of fins 106 until it reaches the spacer layer 112.

Figure 4A:
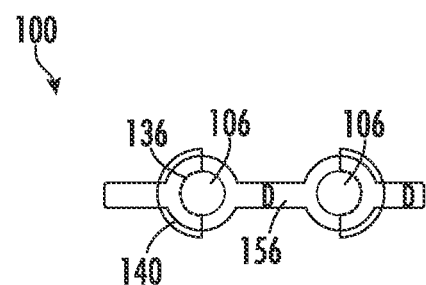
FIG. 4A is a top view of the device following formation of a gate material, according to embodiments of the present disclosure.
Figure 4B:
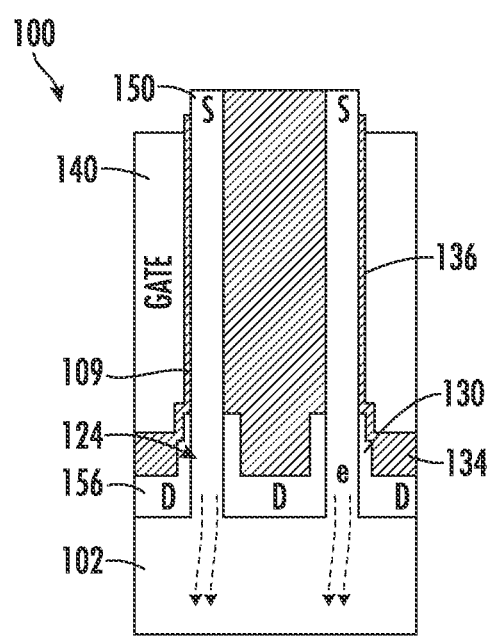
FIG. 4B is a cross-sectional side view of the device following formation of a gate material, according to embodiments of the present disclosure.

In FIGS. 4A-4B, the spacer layer 112 may then be removed (e.g., etched) from over the fins 106, and an oxide spacer 134 may be formed over the doped layer 130. In some embodiments, the oxide spacer 134 may be $SiO_2$. A gate oxide layer 136 may then be formed over the sidewalls 109 of the plurality of fins 106, and a gate material 140 may be formed over the gate oxide layer 136. In some embodiments, the pillar (Si) 106 may be fully or partially surrounded by the gate 140. In some embodiments, the gate oxide layer 136 is a high-temperature gate $SiO_2$ deposited along the sidewalls 109 of the fins 106 and between two or more of the fins 106, as shown in FIG. 4B. In some embodiments, the gate material 140 may be a polysilicon gate refill, such as a p-type or n-type polysilicon, which is doped.

As further shown, a source region 150 may be formed in an upper portion 152 of the fins 106, while a drain 156 may be formed in the doped layer 130, proximate the portion 124 of the fins 106. The source region 150 and the drain 156 may be formed using known source/drain (S/D) implants. Following wordline formation, the device 100 includes a set of mirrored gates and a reserved electronic path (V) inside the fins 106 to avoid BJT floating-body issues. Furthermore, bottom contact area is utilized to reduce contact Rs.

Figure 5:
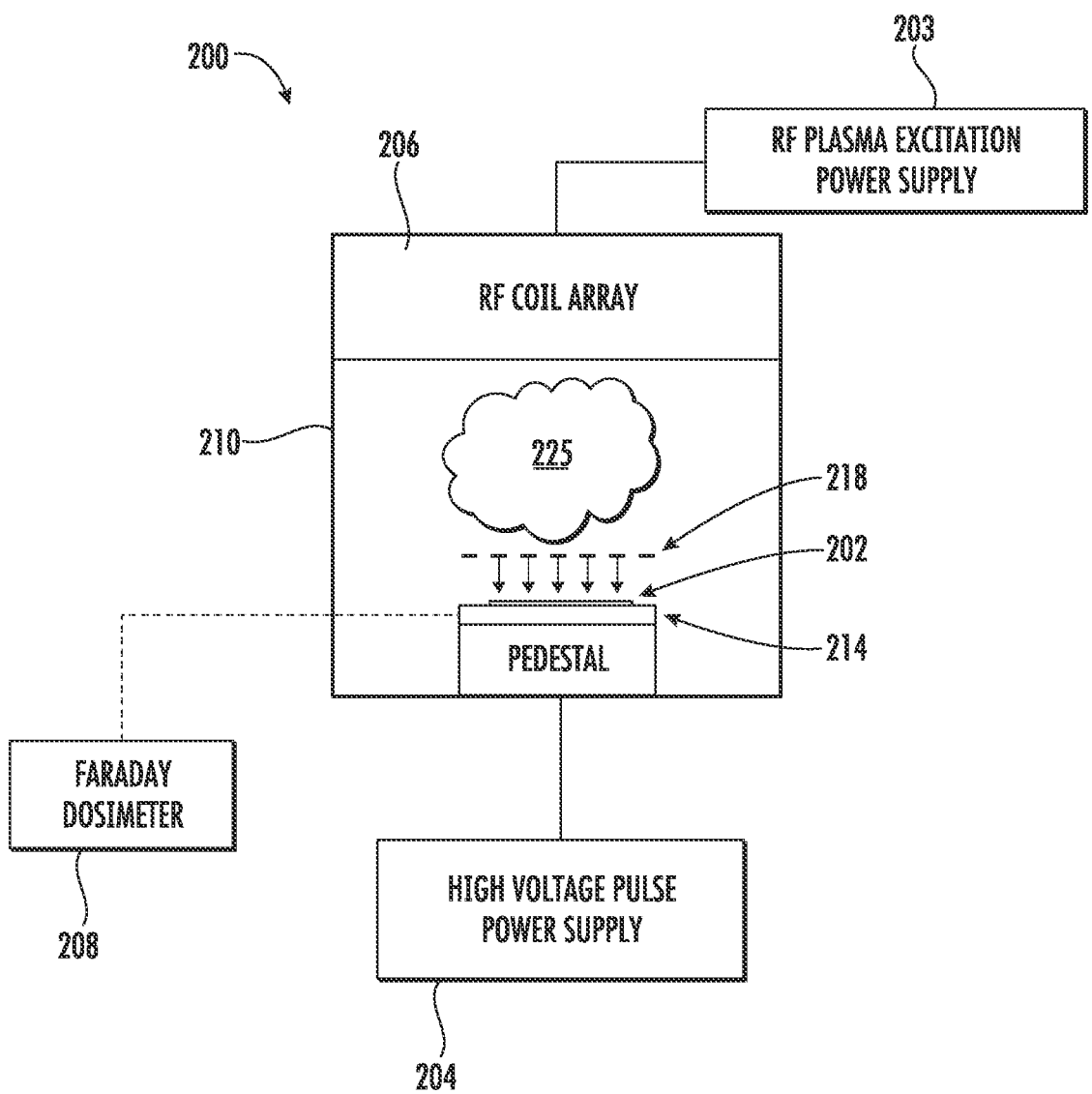
FIG. 5 illustrates a schematic diagram of a processing apparatus according to embodiments of the present disclosure.

Referring to FIG. 5, an example system 200 operable to form the doped layer 130 will be described. The system 200 may be a PLAD system operable to provide pulsed RF-excited continuous plasma doping to the device 100. As shown, the system 200 may include a plasma power supply 203, a voltage pulse power supply 204, an RF coil array 206, and a dosimeter 208. Within a plasma chamber 210 is a wafer/substrate 202, which may be the same or similar to the substrate 102 described above. A platen/pedestal 214 may support the wafer 202, and a sheath 218 may be formed above the wafer 202. The dosimeter 208 may be a Faraday dosimeter or other type of sensor that directly measures the dose of ions received by the wafer 202. Although non-limiting, the dosimeter can be located on the pedestal 214, proximate to the wafer 202.

During use, the plasma power supply 203 and the RF coil array 206 deliver radio frequency excitation to generate a plasma 225 when gaseous species are delivered into the plasma chamber 210. For example, the plasma power supply 203 may be an RF powered inductively coupled power source to generate inductively coupled plasma 225, as known in the art. Gaseous species may be delivered from one or more gas sources (not separately shown) to generate ions of any suitable species, such as neon, carbon, nitrogen, oxygen, argon, to name just a few non-limiting examples of ion species.

The voltage pulse power supply 204 may generate a bias voltage between the wafer 202 and the plasma chamber 210. As such, when the voltage pulse power supply 204 generates a voltage between the plasma chamber 210 and the substrate 202, a similar, but slightly larger, voltage difference is generated between the plasma 225 and the substrate 202. In one non-limiting example, a 5000 (5 kV) voltage difference established between the plasma chamber 210 and the substrate 202 (or, equivalently, pedestal 214) may generate a voltage difference of approximately 5005 V to 5030 V between the plasma 225 and the substrate 202.

In some embodiments, the voltage pulse power supply 204 may generate a bias voltage as a pulsed voltage signal, wherein the pulsed voltage signal is applied in a repetitive and regular manner, to generate a pulse routine comprising a plurality of extraction voltage pulses. For example, a pulse routine may apply voltage pulses of 500 V magnitude, 1000 V magnitude, 2000 V magnitude, 5000 V magnitude, or 10,000 V magnitude in various non-limiting embodiments. The system 200 may further include a controller (not shown), to control the pulsing routine applied to the substrate 202, in order to amorphize the surfaces of the substrate 202 left uncovered by the spacer layer 112.

According to various embodiments, the plasma 225 may be formed at least in part of ions that constitute an amorphizing species, wherein the amorphizing species may be any suitable ion capable of amorphizing an initially crystalline region of materials, such as the substrate 202. In various non-limiting embodiments, such suitable ions may include an inert gas ion, silicon, carbon, nitrogen, oxygen, metal, or other species. When the plasma 225 is present in the plasma chamber 210, the controller may generate a signal for the voltage pulse power supply 204 to apply a pulse routine to the substrate 202, where the pulse routine constitutes a plurality of extraction voltage pulses. As such, when the extraction voltage pulses are applied between the substrate 202 and plasma 225, ions are extracted in pulsed form from the plasma 225, generating a plurality of ion pulses that are directed to the substrate 202 to form the doped layer 130.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

In various embodiments, design tools can be provided and configured to create the datasets used to pattern the semiconductor layers of the device 100, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/ hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the Detailed Description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
   providing a plurality of fins extending from a substrate in a first direction;
   forming a spacer layer over the plurality of fins;
   etching the substrate to expose a base portion of the plurality of fins, wherein a thickness, in a second direction, of the base portion of the plurality of fins and an upper portion of the plurality of fins is the same, and wherein the second direction is perpendicular to the first direction;
   forming a conformal doped layer along an upper surface of the substrate and along the base portion of the plurality of fins having the same thickness as the upper portion of the plurality fins, wherein the conformal doped layer defines a trench; and
   forming an oxide spacer over the conformal doped layer, including within the trench.

2. The method of claim 1, further comprising:
   removing the spacer layer from over the plurality of fins;
   forming a gate oxide layer over the plurality of fins; and
   forming a gate material over the gate oxide layer.

3. The method of claim 2, further comprising forming the gate oxide layer over the oxide spacer.

4. The method of claim 1, further comprising forming a source in an upper portion of the plurality of fins and forming a drain in the conformal doped layer.

5. The method of claim 1, wherein forming the spacer layer over the plurality of fins comprises:
   forming an oxide layer over an outer surface of each of the plurality of fins; and
   forming a nitride layer over the oxide layer.

6. The method of claim 1, wherein forming the conformal doped layer comprises doping the base portion of the plurality of fins and the upper surface of the substrate using a plasma doping process.

7. The method of claim 1, wherein etching the substrate to expose the base portion of the plurality of fins further comprises recessing the upper surface of the substrate.

8. A method of forming a dynamic random-access memory device, the method comprising:
   providing a plurality of fins extending from a substrate in a first direction;
   forming a spacer layer over the plurality of fins;
   etching the substrate to expose a base portion of the plurality of fins, wherein a thickness, in a second direction, of the base portion of the plurality of fins and an upper portion of the plurality of fins is the same, and wherein the second direction is perpendicular to the first direction;

forming, using a plasma doping process, a conformal doped layer along an upper surface of the substrate and along the base portion of the plurality of fins having the same thickness as the upper portion of the plurality fins, wherein the conformal doped layer defines a trench; and forming an oxide spacer over the conformal doped layer, including within the trench.

9. The method of claim 8, further comprising:
removing the spacer layer from over the plurality of fins;
forming a gate oxide layer over the plurality of fins; and
forming a gate material over the gate oxide layer.

10. The method of claim 9, further comprising forming the gate oxide layer over the oxide spacer.

11. The method of claim 8, further comprising forming a source in an upper portion of the plurality of fins and forming a drain in the conformal doped layer.

12. The method of claim 8, wherein forming the spacer layer over the plurality of fins comprises:
forming an oxide layer over an outer surface of each of the plurality of fins; and
forming a nitride layer over the oxide layer.

13. A method of forming a $4F^2$ vertical dynamic random-access memory device, the method comprising:
providing a plurality of pillars extending from an upper surface of a substrate in a first direction;
forming a spacer layer over the plurality of pillars;
exposing a base portion of the plurality of pillars by etching the upper surface of the substrate, wherein a thickness, in a second direction, of the base portion of the plurality of fins and an upper portion of the plurality of fins is the same, and wherein the second direction is perpendicular to the first direction;

forming, using a plasma doping process, a conformal doped layer along an upper surface of the substrate and along the base portion of the plurality of fins having the same thickness as the upper portion of the plurality fins, wherein the conformal doped layer defines a trench; and forming an oxide spacer over the conformal doped layer.

14. The method of claim 13, further comprising:
removing the spacer layer from over the plurality of pillars;
forming a gate oxide layer over the plurality of pillars; and
forming a gate material over the gate oxide layer.

15. The method of claim 14, further comprising forming the gate oxide layer over the oxide spacer.

16. The method of claim 13, further comprising forming a source in an upper portion of the plurality of pillars and forming a drain in the conformal doped layer.

17. The method of claim 13, wherein forming the spacer layer over the plurality of pillars comprises:
forming an oxide layer over an outer surface of each of the plurality of pillars; and
forming a nitride layer over the oxide layer.

* * * * *